(12) United States Patent
Hou et al.

(10) Patent No.: US 11,978,767 B2
(45) Date of Patent: May 7, 2024

(54) POWER SEMICONDUCTOR DEVICE, PACKAGING STRUCTURE, AND ELECTRONIC DEVICE

(71) Applicant: HUAWEI TECHNOLOGIES CO., LTD., Guangdong (CN)

(72) Inventors: Zhaozheng Hou, Dongguan (CN); Yunbin Gao, Shenzhen (CN); Yiyu Wang, Dongguan (CN); Fei Hu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 136 days.

(21) Appl. No.: 17/708,268

(22) Filed: Mar. 30, 2022

(65) Prior Publication Data

US 2022/0320271 A1    Oct. 6, 2022

(30) Foreign Application Priority Data

Mar. 31, 2021    (CN) .......................... 202110347525.2

(51) Int. Cl.
*H01L 29/06*    (2006.01)
*H01L 23/31*    (2006.01)
(Continued)

(52) U.S. Cl.
CPC ...... *H01L 29/0619* (2013.01); *H01L 23/3171* (2013.01); *H01L 23/3192* (2013.01);
(Continued)

(58) Field of Classification Search
CPC ............. H01L 29/0619; H01L 23/3171; H01L 23/3192; H01L 23/49861; H01L 29/0607;
(Continued)

(56) References Cited

U.S. PATENT DOCUMENTS 6,344,680 B1    2/2002    Yamaguchi
8,729,705 B2    5/2014    Wang et al.
(Continued)

FOREIGN PATENT DOCUMENTS

CN    1329982 C    8/2007
CN    101640190 A    2/2010
(Continued)

*Primary Examiner* — Shahed Ahmed
*Assistant Examiner* — Khatib A Rahman
(74) *Attorney, Agent, or Firm* — WOMBLE BOND DICKINSON (US) LLP

(57) ABSTRACT

This application provides a power semiconductor device, which includes: a semiconductor substrate, where the semiconductor substrate is doped with a first-type impurity; an epitaxial layer, that is doped with the first-type impurity, the epitaxial layer is disposed on a surface of the semiconductor substrate, a first doped region doped with a second-type impurity is disposed on a first surface that is of the epitaxial layer and that is away from the semiconductor substrate, and a circumferential edge of the first surface of the epitaxial layer has a scribing region; a first metal layer, disposed on one side that is of the epitaxial layer and that is away from the semiconductor substrate, where the first metal layer is electrically connected to the epitaxial layer; a second metal layer, disposed on one side that is of the epitaxial layer and that is away from the semiconductor substrate; and a passivation layer.

20 Claims, 6 Drawing Sheets

(51) Int. Cl.
*H01L 23/498* (2006.01)
*H01L 29/16* (2006.01)
*H01L 29/872* (2006.01)

(52) U.S. Cl.
CPC .... *H01L 23/49861* (2013.01); *H01L 29/0607* (2013.01); *H01L 29/1608* (2013.01); *H01L 29/872* (2013.01)

(58) Field of Classification Search
CPC . H01L 29/1608; H01L 29/872; H01L 23/562; H01L 29/404; H01L 29/0638; H01L 29/7811; H01L 2224/02166; H01L 29/0603; H01L 23/3121; H01L 23/49; H01L 27/0203; H01L 29/0684
See application file for complete search history.

(56) References Cited

U.S. PATENT DOCUMENTS

| | | |
|---|---|---|
| 2007/0069336 A1 | 3/2007 | Ning |
| 2010/0289110 A1 | 11/2010 | Tarui et al. |
| 2013/0037852 A1 | 2/2013 | Tamaki |
| 2013/0256826 A1 | 10/2013 | Gambino et al. |
| 2014/0306298 A1 | 10/2014 | Hirler |
| 2014/0346522 A1* | 11/2014 | Disney .............. H01L 23/49575 438/123 |
| 2015/0048517 A1 | 2/2015 | Keser et al. |
| 2019/0245043 A1* | 8/2019 | Uchida ............... H01L 29/0619 |
| 2020/0227526 A1* | 7/2020 | Li ..................... H01L 21/32133 |
| 2021/0183795 A1* | 6/2021 | Lee ..................... H01L 23/4952 |
| 2022/0093791 A1* | 3/2022 | Van Brunt ......... H01L 29/0638 |
| 2022/0293800 A1* | 9/2022 | Tao .................... H01L 29/0619 |

FOREIGN PATENT DOCUMENTS

| | | |
|---|---|---|
| CN | 103579303 A | 2/2014 |
| CN | 106298869 A | 1/2017 |
| JP | H0249429 A | 2/1990 |
| JP | H0653219 A | 2/1994 |
| JP | 2005150661 A | 6/2005 |
| JP | 5607339 B2 | 10/2014 |
| JP | 2015179774 A | 10/2015 |
| JP | 2018093177 A | 6/2018 |
| WO | 2013140572 A1 | 9/2013 |
| WO | 2013190659 A1 | 12/2013 |
| WO | 2020035938 A1 | 2/2020 |
| WO | 2020208706 A1 | 10/2020 |

* cited by examiner

POWER SEMICONDUCTOR DEVICE, PACKAGING STRUCTURE, AND ELECTRONIC DEVICE

CROSS-REFERENCE TO RELATED APPLICATIONS

This application claims priority to Chinese Patent Application No. 202110347525.2, filed on Mar. 31, 2021, which is hereby incorporated by reference in its entirety.

TECHNICAL FIELD

This application relates to the field of electronic device technologies, and in particular, to a power semiconductor device, a packaging structure, and an electronic device.

BACKGROUND

In a plurality of fields such as power systems, data centers, electric vehicles, and new energy applications, it is a common means to implement energy conversion by using a power electronic device. As a basic unit of a power electronic converter, a power semiconductor device is essential to the power electronic converter. A semiconductor device usually includes a multi-layer structure, including a semiconductor substrate layer, a metal electrode layer, a passivation layer, a plastic packaging layer, and the like. The layer structures have different inherent thermal characteristics. In reliability test processes such as temperature cycling and temperature shock, shear stress is generated between the layer structures due to a coefficient of thermal expansion (CTE) mismatch. When a quantity of cycles exceeds a specific value, the stress even exceeds yield strength of a metal material, causing the metal electrode layer to deform. In this case, the shear stress is almost completely borne by the rigid passivation layer. As a result, an inner side of the passivation layer cracks. If a crack further expands, the semiconductor device may fail.

SUMMARY

This application provides a power semiconductor device, a packaging structure, and an electronic device, to reduce a risk of a failure of the power semiconductor device.

According to a first aspect, this application provides a semiconductor device. The semiconductor device includes a semiconductor substrate, an epitaxial layer, a first metal layer, a second metal layer, and a passivation layer. The semiconductor substrate is doped with a first-type impurity. The epitaxial layer is disposed on a surface of the semiconductor substrate, and the epitaxial layer may also be doped with the first-type impurity. In addition, a first doped region doped with a second-type impurity may be further disposed on a first surface that is of the epitaxial layer and that is away from the semiconductor substrate, and a circumferential edge of the first surface of the epitaxial layer has a scribing region. The first metal layer is disposed on one side that is of the epitaxial layer and that is away from the semiconductor substrate, and the first metal layer is electrically connected to the epitaxial layer. The second metal layer is disposed on one side that is of the epitaxial layer and that is away from the semiconductor substrate. In addition, in a direction from an edge to a center of the semiconductor device, the second metal layer may be located between the scribing region and an edge of the first metal layer. The passivation layer may be disposed on one side that is of the first metal layer and that is away from the semiconductor substrate. The passivation layer may be of an annular structure. The passivation layer may cover the second metal layer and the edge of the first metal layer, and is configured to protect against ingress of external impurities and moisture, so that stability and reliability of the power semiconductor device can be improved.

In some embodiments, the second metal layer is closer to the edge of the power semiconductor device than the first metal layer, so that the passivation layer forms a step structure at the second metal layer at the edge of the power semiconductor device. In reliability tests such as temperature cycling and temperature shock, a stress concentration point of the passivation layer may be transferred to the step structure formed by the passivation layer at the second metal layer. Even if the passivation layer cracks at the step structure, an electrical functional region of the power semiconductor device is not affected, so that a risk of an electrical failure of the power semiconductor device can be reduced.

In some embodiments, the power semiconductor device is a Schottky diode or a power metal-oxide semiconductor field-effect transistor.

In some embodiments, the second metal layer may include a plurality of groups of metal structures, and the plurality of groups of metal structures may be disposed in pairs at spacings in an annular region. In this way, in a circumferential direction, an edge of the passivation layer may form a plurality of step structures, so that the stress concentration point of the passivation layer can be effectively transferred to the edge of the passivation layer.

In some embodiments, a cross section that is of the epitaxial layer and that is perpendicular to a thickness direction of the power semiconductor device may be rectangular. In this case, the annular region may alternatively be a rectangular ring matching a shape of the epitaxial layer, and four corner parts of the annular region are respectively disposed opposite to four corner parts of the epitaxial layer. There may be four groups of metal structures. The four groups of metal structures may be respectively disposed on the four corner parts of the annular region, so that step structures are respectively formed on four corner parts of the passivation layer, and the stress concentration point of the passivation layer is transferred to the four corner parts of the edge.

In some embodiments, each group of metal structures may include at least one metal block, and the at least one metal block may be arranged in a direction from the edge to the center of the power device. In this way, at least one step structure may be formed at the edge of the passivation layer from inside to outside, so that the stress concentration point of the passivation layer is more effectively transferred to the edge of the passivation layer.

For example, there may be one, two, three, or the like metal blocks in each group of metal structures. Correspondingly, one, two, or three step structures may be formed at the edge of the passivation layer.

In some embodiments, the metal block may include a first part and a second part that are connected to each other and are separated by an included angle. In some embodiments, the included angle between the first part and the second part may range from 0° to 180°.

For example, the first part and the second part may be perpendicular to each other. In this case, the first part and the second part are respectively disposed along two adjacent sides of the first surface of the epitaxial layer. This disposing manner can be used to improve a stress concentration degree, of the passivation layer, at a location of the metal block, so that impact on the electrical functional region of the power semiconductor device is reduced.

In addition, in actual application, the included angle formed by the first part and the second part may be disposed toward the edge of the power semiconductor device, or may be disposed opposite to the edge of the power semiconductor device. This is not limited in this application. Both of the two disposing manners can be used to improve the stress concentration degree, of the passivation layer, at the location of the metal block.

In some embodiments, a cross section that is of the metal block and that is perpendicular to the thickness direction of the power semiconductor device may be step-shaped. The metal block may include a step plane and a connection surface connected between two adjacent step planes. The step plane and the connection surface may be respectively disposed along two adjacent edges of the first surface of the epitaxial layer. This disposing manner can also be used to improve a stress concentration degree, of the passivation layer, at a location of the metal block.

In some embodiments, a step form of the metal block may be raised in different manners. For example, the step form of the metal block may be raised from lower right to upper left, or may be raised from lower left to upper right. This is not limited in this application. Both of the two disposing manners can be used to improve the stress concentration degree, of the passivation layer, at the location of the metal block.

In some embodiments, a cross section that is of the metal block and that is perpendicular to the thickness direction of the power semiconductor device may further be arc-shaped. In some embodiments, the metal block may protrude toward the edge of the power semiconductor device, and a central angle of an arc may range from 0° to 90°. For example, when the central angle of the arc is 90°, tangent lines of endpoints on two sides of the arc may be respectively disposed along two adjacent edges of the first surface of the epitaxial layer. This disposing manner can also be used to improve a stress concentration degree, of the passivation layer, at a location of the metal block.

In some embodiments, the power semiconductor device may further include a field oxidized layer, the field oxidized layer may be of an annular structure, an outer side of the field oxidized layer and the scribing region are disposed at a spacing, and an inner side of the field oxidized layer is located between the edge of the first metal layer and the epitaxial layer. The second metal layer is disposed between the field oxidized layer and the passivation layer. The field oxidized layer can protect a surface of a terminal region of the power semiconductor device, and reduce impact of an external charge on the terminal region, so that working reliability of the power semiconductor device can be improved.

In some embodiments, the field oxidized layer may be provided with a through hole, and the second metal layer may be electrically connected to the epitaxial layer by using the through hole, so that the second metal layer and the epitaxial layer can maintain equipotential, to further improve reliability of the power semiconductor device.

In addition, a second doped region doped with the first-type impurity may be further disposed at a location that is on the first surface of the epitaxial layer and that is corresponding to the through hole, and the second metal layer may be electrically connected to the second doped region by using the through hole.

In some embodiments, doping density of the first-type impurity in the second doped region may be greater than doping density of the first-type impurity at the epitaxial layer, so that the second metal layer and the epitaxial layer can more effectively maintain equipotential.

In some embodiments, the passivation layer may include at least one layer structure, and the layer structure may be made of a dielectric material. For example, the layer structure may be made of one of silicon dioxide, silicon nitride, or semi-insulated polycrystalline silicon.

In some embodiments, the power semiconductor device may further include a protective layer, the protective layer may also be of an annular structure, and the protective layer may cover the passivation layer and a part of the first metal layer. The protective layer may be configured to mitigate extrusion of a plastic packaging material on a surface of the device in a subsequent packaging process, and can prevent particles in the plastic packaging material from spreading to inside of the device, so that the stability and reliability of the power semiconductor device can be improved. For example, the protective layer may be made of polyimide, p-phenylene benzobisoxazole fiber, or the like.

According to a second aspect, this application further provides a packaging structure. The packaging structure includes a substrate, a lead, and the power semiconductor device in any one of the foregoing possible implementation solutions. The power semiconductor device is disposed on a surface of the substrate. The lead is disposed on a surface that is of the substrate and that is on a same side as the power semiconductor device, the lead is disposed around the power semiconductor device, and a first end of the lead is electrically connected to the power semiconductor device. In reliability tests such as temperature cycling and temperature shock, a stress concentration point of the power semiconductor device may be transferred to a corner region. Even if there is a crack, an electrical functional region of the power semiconductor device is not affected, so that a risk of an electrical failure of the power semiconductor device can be reduced, and reliability of a packaging structure can be further improved.

According to a third aspect, this application further provides an electronic device. The electronic device may include a circuit board and the packaging structure in the foregoing implementation solution. The packaging structure may be fastened on the circuit board by means of soldering or the like. A signal pin may be further disposed in a region that is on the circuit board and that is away from the packaging structure, and the signal pin may be connected to a second end of the lead, so that the packaging structure can be connected to another device by using a cable on the circuit board, and a connection between the power semiconductor device and an external circuit is further implemented. Because a risk of an electrical failure of the power semiconductor device is low, stability of the electronic device can be improved.

SIGNS OF THE ACCOMPANYING DRAWINGS

100—power semiconductor device; 10—semiconductor substrate; 20—epitaxial layer; 30—first metal layer; 40—passivation layer;
50—protective layer; 110—scribing region; 120—terminal region; 130—active region; 21—first doped region; 60—field oxidized layer;
70—second metal layer; 71—metal structure; 711—metal block; 7111—first part; 7112—second part;
7113—step plane; 7114—stepped face; 80—insulation layer; 81—gate; 61—polycrystalline silicon material; 62—gate signal cable;
63—through hole; 200—substrate; and 300—lead frame.

DESCRIPTION OF EMBODIMENTS

To make the objectives, technical solutions, and advantages of this application clearer, the following further describes this application in detail with reference to the accompanying drawings.

In a plurality of fields such as power systems, data centers, electric vehicles, and new energy applications, it is a common means to implement energy conversion by using a power electronic device. As a basic unit of a power electronic converter, a power semiconductor device is essential to the power electronic converter.

Silicon carbide (SiC) is a third-generation wide-bandgap semiconductor material. Compared with a conventional silicon material, the silicon carbide has excellent features such as high critical breakdown field strength, high thermal conductivity, and high intrinsic operating temperature. Power devices such as a Schottky barrier diode (SBD) and a metal-oxide-semiconductor field-effect transistor (MOSFET) produced by using the silicon carbide have advantages such as high junction temperature and a low switching loss. This facilitates high frequency and lightweight of a power electronic system, and is widely applied to fields such as a power factor correction (PFC) rectifier, a photovoltaic inverter, and a vehicle-mounted electric drive system.

The Schottky diode is manufactured according to a principle of metal-semiconductor junction formed by contact between a metal and a semiconductor. Therefore, the Schottky diode is also referred to as a metal-semiconductor diode or a surface barrier diode. The Schottky diode has short reverse recovery time and a low forward conduction voltage. Therefore, the Schottky diode is often used in high-frequency and low-voltage scenarios. The following first provides description by using an example in which the power semiconductor device is the Schottky diode.

Figure 1:
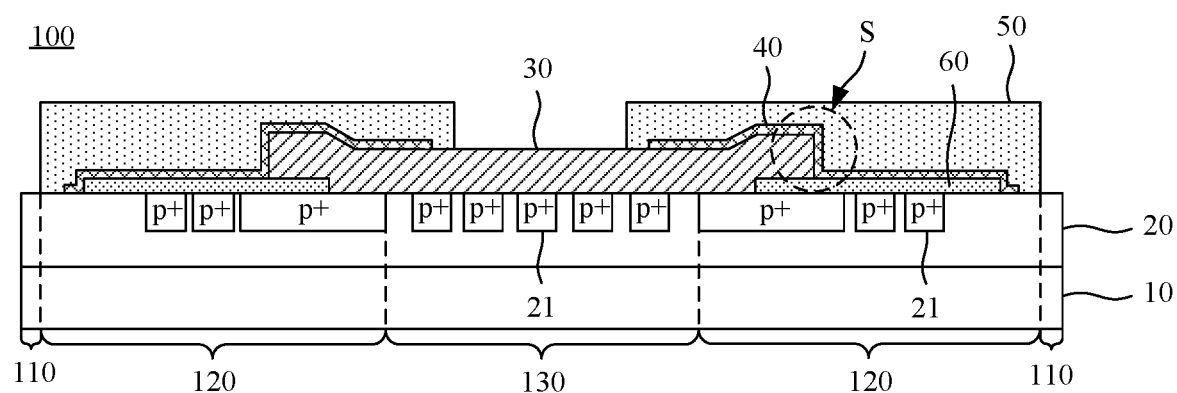
FIG. 1 is a schematic diagram of a cross-sectional structure of a power semiconductor device.

FIG. 1 is a schematic diagram of a cross-sectional structure of a power semiconductor device. Refer to FIG. 1, the power semiconductor device 100 may include a semiconductor substrate 10, an epitaxial layer 20, a first metal layer 30, a passivation layer 40, and a protective layer 50 that are sequentially stacked. In addition, based on division of functional regions, in a direction from an edge to a center, the power semiconductor device may further sequentially include a scribing region 110, a terminal region 120, and an active region 130. A plurality of basic functional cells are disposed in the active region 130 to ensure normal implementation of a function of the semiconductor device. The terminal region 120 can ensure a breakdown voltage of the semiconductor device, to improve working reliability of the semiconductor device. The scribing region 110 may guide subsequent cutting work. After layer structures are manufactured, a wafer may be cut into a plurality of independent power semiconductor devices 100 along the scribing region by using a cutting tool.

In an embodiment, the semiconductor substrate 10 may be a silicon carbide substrate, and the semiconductor substrate 10 may be doped with a first-type impurity. The first-type impurity may be an N-type impurity or a P-type impurity. It may be understood that, if the first-type impurity is the N-type impurity, the formed semiconductor substrate 10 is an N-type semiconductor substrate; and if the first-type impurity is the P-type impurity, the formed semiconductor substrate 10 is a P-type semiconductor substrate. The following embodiment is described by using an example in which the first-type impurity is the N-type impurity.

The epitaxial layer 20 is disposed on a surface of the semiconductor substrate 10, and the epitaxial layer 20 may also be doped with first-type impurity. In an embodiment, doping density of the first-type impurity at the epitaxial layer 20 may be different from doping density of the first-type impurity on the semiconductor substrate 10. For example, the doping density of the first-type impurity at the epitaxial layer 20 may be less than the doping density of the first-type impurity on the semiconductor substrate 10. A performance parameter of the power semiconductor device can be controlled by adjusting the doping density of the first-type impurity at the epitaxial layer 20. For example, when the doping density of the first-type impurity at the epitaxial layer 20 increases, both of the breakdown voltage and characteristic on-resistance that are of the semiconductor device may decrease. Alternatively, when the doping density of the first-type impurity at the epitaxial layer 20 increases, both of the breakdown voltage and the characteristic on-resistance that are of the semiconductor device increase.

In addition, the breakdown voltage and the characteristic on-resistance that are of the semiconductor device are also affected by a thickness of the epitaxial layer 20. For example, as the thickness of the epitaxial layer 20 increases, both of the breakdown voltage and the characteristic on-resistance that are of the semiconductor device increase. As the thickness of the epitaxial layer 20 decreases, both of the breakdown voltage and the characteristic on-resistance that are of the semiconductor device decrease. Therefore, in actual application, the thickness of the epitaxial layer 20 and the doping density of the first-type impurity at the epitaxial layer 20 may be designed based on a requirement of an application scenario, to obtain an appropriate performance parameter.

Still refer to FIG. 1. The epitaxial layer 20 has a first surface disposed away from the semiconductor substrate 10, a plurality of first doped regions 21 are disposed on the first surface of the epitaxial layer 20, and the first doped region 21 is doped with a second-type impurity. It should be understood that, when the first-type impurity is the N-type impurity, the second-type impurity is the P-type impurity. In this case, the first doped region is a P-type doped region. It should be noted that the first doped region 21 may be separately disposed in the active region 130 and the terminal region 120. The first doped region 21 in the active region 130 may be of a strip structure, and a plurality of first doped regions 21 in the active region 130 may be arranged in an array, to form basic functional cells of the power semiconductor device 100. The first doped region 21 in the terminal region 120 may be of an annular structure, and a plurality of first doped regions 21 in the terminal region 120 may be arranged in a radial manner, to horizontally extend an electric field. In this way, voltage withstand efficiency of PN junction in the active region 130 is ensured. As used herein, the annular structure includes both circular annular structures, which may be ring-shaped, and rectangular annular structures, which may be frame-shaped.

The first metal layer 30 is disposed on the first surface of the epitaxial layer 20. In some embodiments, the first metal layer 30 may cover the active region 130, to ensure reliable contact with the N-type semiconductor in the active region 130. A material of the first metal layer 30 is not limited. For example, the first metal layer 30 may be titanium, tungsten, molybdenum, gold, silver, aluminum, nickel, or the like. In this embodiment, the first metal layer 30 may be used as a positive electrode of the power semiconductor device 100, and the N-type semiconductor (the semiconductor substrate 10 and the epitaxial layer 20) may be used as a negative electrode of the power semiconductor device 100. After the first metal layer 30 is in contact with the N-type semiconductor, because power functions of the first metal layer 30 and the N-type semiconductor are different, electrons in the N-type semiconductor are emitted from a high-energy level to a low-energy metal level, surface neutrality is destroyed, a depletion layer is formed, an electric field from the N-type semiconductor to the first metal layer 30 is established, and the electrons drift from the first metal layer 30 to the N-type semiconductor. A stable Schottky barrier is formed when relative equilibrium of electron emission and drift motion is achieved. When a forward bias voltage is added to two ends of Schottky junction, that is, the first metal layer 30 is connected to a positive electrode of a power supply, and the N-type semiconductor substrate is connected to a negative electrode of the power supply, the Schottky barrier is reduced, the electron emission is enhanced, and a forward current is formed when the forward bias voltage is high enough. On the contrary, when a reverse bias voltage is added to the two ends of the Schottky junction, the Schottky barrier is increased, the electron emission is suppressed, and a reverse block is formed.

The passivation layer 40 may be disposed on one side that is of the first metal layer 30 and that is away from the semiconductor substrate. In some embodiments, the passivation layer 40 may be of an annular structure, an inner side of the passivation layer 40 may cover an edge of the first metal layer 30, and an outer side of the passivation layer 40 and the scribing region 110 are disposed at a spacing. The passivation layer 40 can protect against ingress of external impurities and moisture, so that stability and reliability of the power semiconductor device 100 can be improved. In some embodiments, the passivation layer 40 may be of a single-layer structure. In this case, the passivation layer 40 may be made of one of silicon dioxide, silicon nitride, or semi-insulated polycrystalline silicon. In some other embodiments, the passivation layer 40 may alternatively be of a multi-layer structure, and materials of layer structures are different and may be one of silicon dioxide, silicon nitride, or semi-insulated polycrystalline silicon. It should be noted that orientation terms such as "inside" and "outside" used in embodiments of this application are mainly described based on a structure of the power semiconductor device 100. One side close to an edge of the power semiconductor device 100 is defined as an outer side, and one side away from the edge of the power semiconductor device 100 is defined as an inner side.

The protective layer 50 may be disposed on one side that is of the passivation layer 40 and that is away from the semiconductor substrate 10. Alternatively, the protective layer 50 may be of an annular structure. An inner side of the protective layer 50 may cover the passivation layer 40 and a part of the first metal layer 30, and an outer side of the protective layer 50 may extend to the scribing region 110. In this embodiment, the protective layer 50 may be made of polyimide (PI), polybenzoxazole (PBO), or the like. The protective layer 50 may be configured to mitigate extrusion of a plastic packaging material on a surface of the device in a subsequent packaging process, and can prevent particles in the plastic packaging material from spreading to inside of the device, so that the stability and reliability of the power semiconductor device 100 can be improved.

It may be understood that, in some embodiments, a field oxidized layer 60 may be further disposed in the terminal region 120 of the power semiconductor device 100. The field oxidized layer 60 may also be of an annular structure, an inner side of the field oxidized layer 60 is located between the first metal layer 30 and the epitaxial layer 20, and an outer side of the field oxidized layer 60 and the scribing region 110 are disposed at a spacing. A material of the field oxidized layer 60 may be silicon dioxide ($SiO_2$), phosphosilicate glass (PSG), borophosphosilicate glass (BPSG), or the like. The field oxidized layer 60 can protect a surface of the terminal region 120, and reduce impact of an external charge on the terminal region 120, so that working reliability of the power semiconductor device 100 can be improved.

In the power semiconductor device in the embodiment shown in FIG. 1, because inherent thermal characteristics of the layer structures are inconsistent, in reliability test processes such as temperature cycling and temperature shock, shear stress is generated between layer structures such as the semiconductor substrate 10, the passivation layer 40, and the protective layer 50 due to a CTE value mismatch. When a quantity of cycles exceeds a specific value, the stress even exceeds yield strength of the metal material of the first metal layer 30, causing deformation of the first metal layer 30. In this case, the shear stress is almost completely borne by the rigid passivation layer 40. As a result, an inner side of the passivation layer 40 cracks.

In addition, because the first metal layer 30 is thick and has a large overall size, the deformation of the first metal layer 30 is more severe. Compared with a conventional silicon material semiconductor substrate, a CTE value of a silicon carbide material differs greatly from a CTE value of a material of the passivation layer 40. Therefore, a stress concentration problem is also more severe, and the stress is especially likely to be concentrated in a step region S formed by the passivation layer 40 at the edge of the first metal layer 30. Consequently, a risk of the passivation layer 40 in the region cracking is further increased. If a crack further expands, an electrical function region of the device is affected, and therefore the power semiconductor device 100 may fail.

Figure 2:
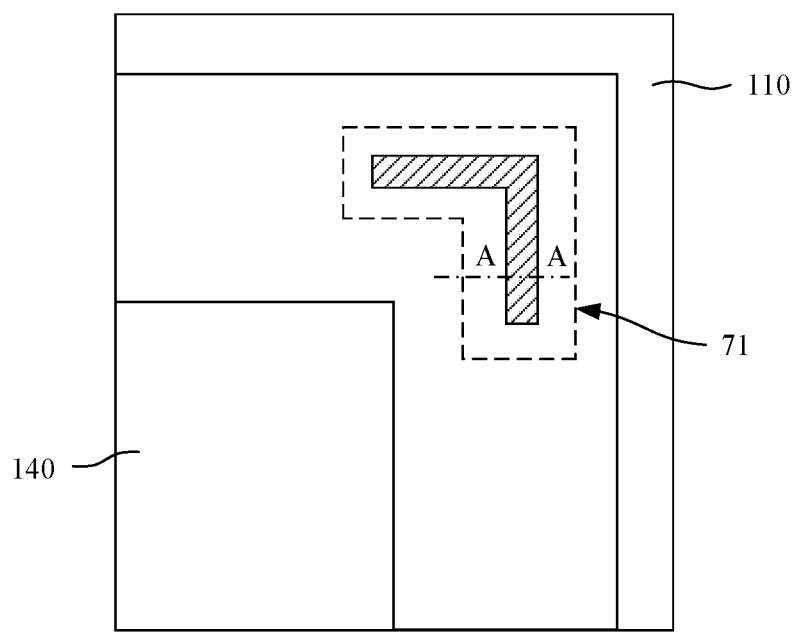
FIG. 2 is a schematic diagram of a partial planar structure of a power semiconductor device according to an embodiment of this application.
Figure 3:
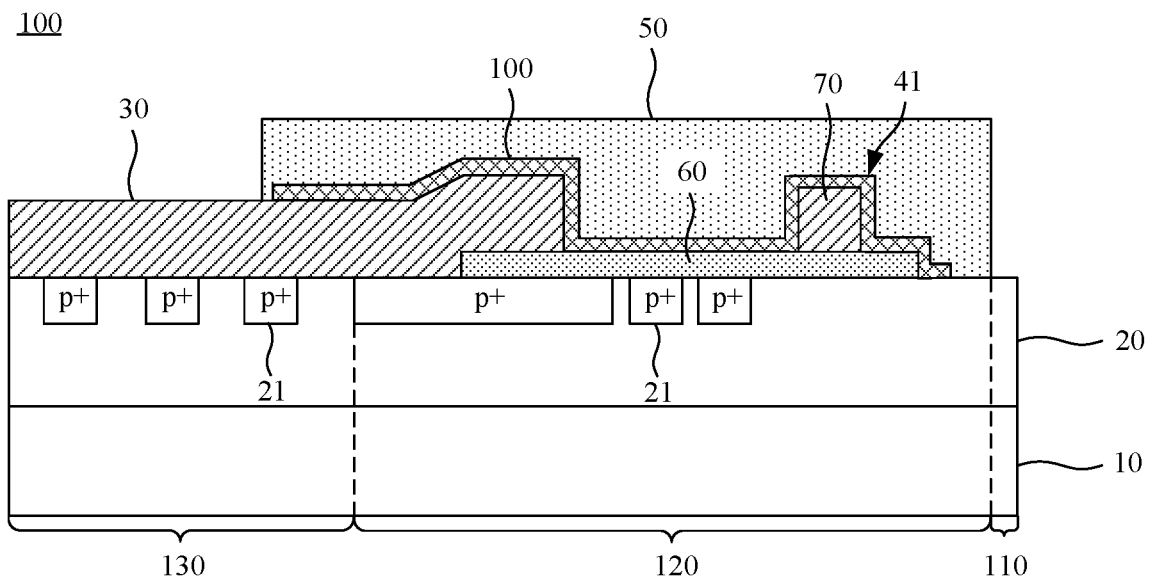
FIG. 3 is a schematic diagram of a cross-sectional structure of the power semiconductor device shown in FIG. 2 at an A-A location.
Figure 4:
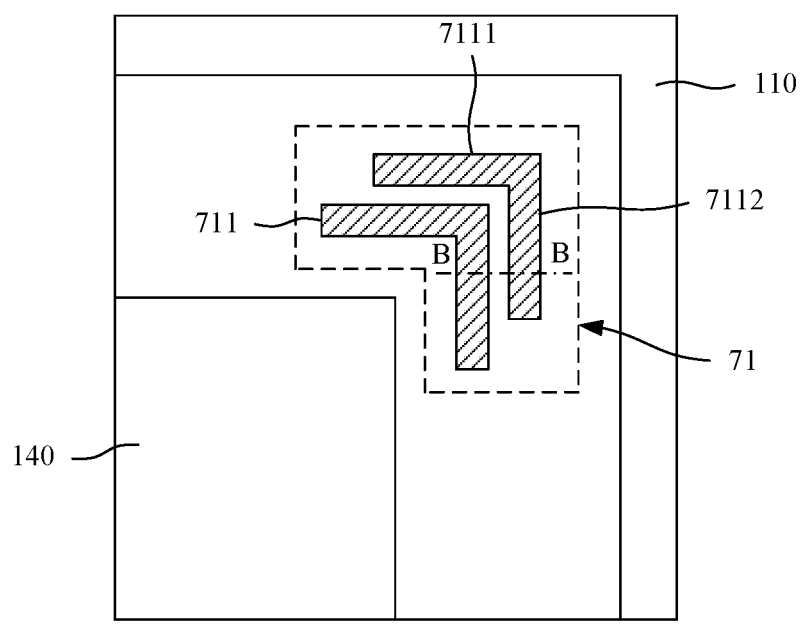
FIG. 4 is a schematic diagram of a partial planar structure of another power semiconductor device according to an embodiment of this application.

FIG. 2 is a schematic diagram of a partial planar structure of a power semiconductor device according to an embodiment of this application, and FIG. 3 is a schematic diagram of a cross-sectional structure of the power semiconductor device shown in FIG. 2 at an A-A location. Refer to FIG. 3 and FIG. 4, for the foregoing problem, in some embodiments of this application, the power semiconductor device 100 may further include a second metal layer 70. The second metal layer 70 is disposed between the field oxidized layer 60 and the passivation layer 40 in a stacking direction. In addition, in a direction from an edge to a center of the power semiconductor device 100, the second metal layer 70 is located in an annular region between the scribing region 110 and the edge of the first metal layer 30. Therefore, the second metal layer 70 is closer to the edge of the power semiconductor device 100 than the first metal layer 30, and a projection of the second metal layer 70 on the first surface of the epitaxial layer 20 is located on an outer side of the first doped region 21 at the most edge of the terminal region 120, that is, the second metal layer 70 is located outside an electrical functional region 140 of the power semiconductor device 100, so that the passivation layer 40 forms a step structure 41 at the second metal layer 70 at the edge of the power semiconductor device 100. Based on verification of experiments and simulation results, in the reliability test processes such as temperature cycling and temperature shock, a stress concentration point of the passivation layer 40 is more likely to be concentrated at the step structure 41 close to the edge of the power semiconductor device 100. Therefore, the stress concentration point in the reliability test process may be transferred to an edge region of the semiconductor device by disposing the second metal layer 70. Even if the passivation layer 40 cracks at the step structure 41 in the region, an electrical functional region of the semiconductor device is not affected, so that a risk of an electrical failure of the semiconductor device can be reduced.

A material of the second metal layer 70 may be the same as the material of the first metal layer 30, for example, may be titanium, tungsten, molybdenum, gold, silver, aluminum, or nickel. In this way, incoming materials of the second metal layer 70 and the first metal layer 30 can be normalized. This can help reduce manufacturing costs of the power semiconductor device 100.

In an embodiment, the second metal layer 70 may include a plurality of groups of metal structures 71. The plurality of groups of metal structures 71 may be distributed in the annular region between the scribing region 110 and the edge of the first metal layer 30 at spacings. Therefore, in a circumferential direction, an edge of the passivation layer 40 may form a plurality of step structures 41, so that the stress concentration point of the passivation layer 40 can be effectively transferred to the edge of the passivation layer 40.

For example, in some embodiments, cross sections of the epitaxial layer 20 and the semiconductor substrate 10 in a direction perpendicular to a thickness of the power semiconductor device 100 may be rectangular. In this case, the annular region between the scribing region 110 and the edge of the first metal layer 30 is also approximately a rectangular ring (e.g., a frame structure), and four corner parts of the annular region are respectively disposed opposite to four corner parts of the epitaxial layer 20. The second metal layer 70 may include four groups of metal structures, and the four groups of metal structures 71 may be respectively located at the four corner parts of the annular region, to respectively form the step structures 41 at the four corner parts of the passivation layer 40, and further transfer the stress concentration point of the passivation layer 40 to the four corner parts of the passivation layer 40.

Figure 5:
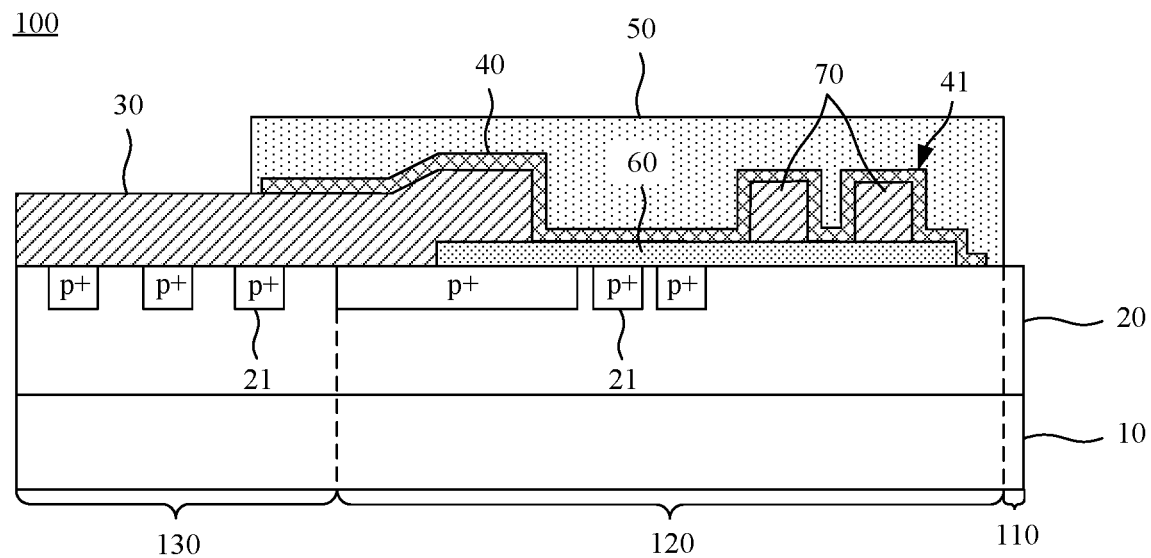
FIG. 5 is a schematic diagram of a cross-sectional structure of the power semiconductor device shown in FIG. 4 at a B-B location.

FIG. 4 is a schematic diagram of a partial planar structure of another power semiconductor device according to an embodiment of this application, and FIG. 5 is a schematic diagram of a cross-sectional structure of the power semiconductor device shown in FIG. 4 at a B-B location. Refer to FIG. 4 and FIG. 5, in this embodiment of this application, each group of metal structures 71 may include at least one metal block 711. For example, there may be one, two, or three metal blocks 711 in each group of metal structures 71. In FIG. 5, an example in which each group of metal structures 71 includes two metal blocks 711 is used for description. In this case, the two metal blocks 711 may be arranged in a direction from an edge to a center of the power semiconductor device 100, to form an inner step structure 41 and an outer step structure 41 at the edge of the passivation layer 40. This helps more effectively transfer the stress concentration point of the passivation layer 40 to the edge of the passivation layer 40.

Still refer to FIG. 4 and FIG. 5. The metal block 711 may include a first part 7111 and a second part 7112 that are connected to each other and are separated by an included angle. In an embodiment, the included angle between the first part 7111 and the second part 7112 may range from 0° to 180°. This is not specifically limited in this application. For example, the first part 7111 and the second part 7112 may be perpendicular to each other, that is, a cross section shape of the metal block 711 is L-shaped. The metal block 711 is disposed close to the corner part of the epitaxial layer 20. When a cross section shape of the epitaxial layer 20 is rectangular, the first part 7111 and the second part 7112 may be respectively disposed along two adjacent edges of a first surface of the epitaxial layer 20. This disposing manner helps improve a stress concentration degree, of the passivation layer 40, at the metal structure, so that impact on an electrical functional region of the power semiconductor device 100 is reduced.

In addition, in this embodiment of this application, as shown in FIG. 4, the included angle formed by the first part 7111 and the second part 7112 may be disposed opposite to the edge of the power semiconductor device 100, or may be disposed toward the edge of the power semiconductor device 100. This is not limited in this application. Both of the two disposing manners can be used to improve the stress concentration degree, of the passivation layer 40, at the metal structure 71. It may be understood that, in each group of metal structures 71, the metal blocks 711 may be disposed in a same direction. This helps reduce space occupied by the metal structure 71, and further reduce impact on an overall structure size of the power semiconductor device 100.

Figure 6:
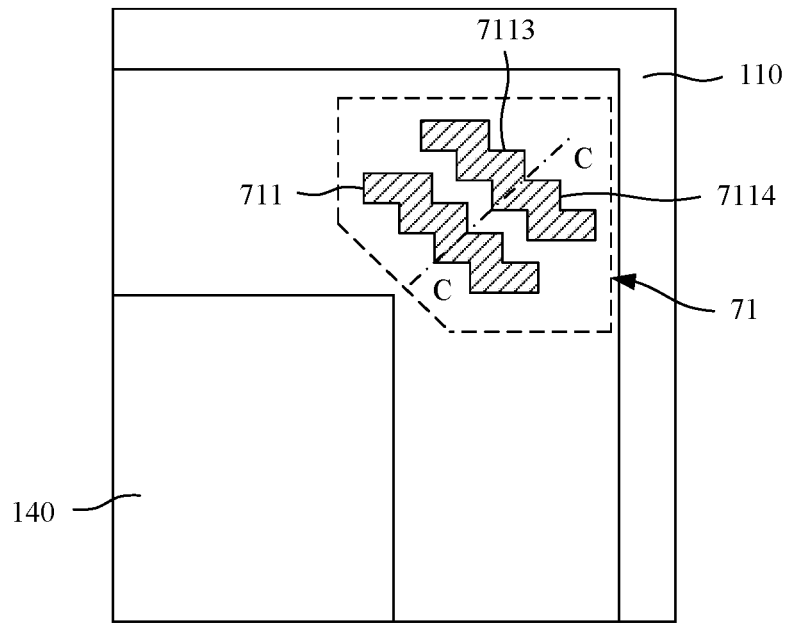
FIG. 6 is a schematic diagram of a partial planar structure of still another power semiconductor device according to an embodiment of this application.

FIG. 6 is a schematic diagram of a partial planar structure of still another power semiconductor device according to an embodiment of this application. Refer to FIG. 5 for a schematic diagram of a cross-sectional structure of the power semiconductor device shown in FIG. 6 at a C-C location. Refer to FIG. 5 and FIG. 6. In this embodiment, a section that is of the metal block 711 and that is perpendicular to a thickness direction of the power semiconductor device 100 may be step-shaped. In some embodiments, the metal block 711 may include a step plane 7113 and a connection surface 7114 connected between two adjacent step planes 7113. It may be understood that both of the step plane 7113 and the stepped face 7114 are perpendicular to the first surface of the epitaxial layer 20. The metal block 711 is disposed close to the corner part of the epitaxial layer 20. When the cross section shape of the epitaxial layer 20 is rectangular, the step plane 7113 and the connection surface 7114 that are of the metal block 711 are respectively disposed along two adjacent edges of the first surface of the epitaxial layer 20. Similarly, this disposing manner can also be used to improve the stress concentration degree, of the passivation layer 40, at the metal structure 71, so that impact on the electrical functional region 140 of the power semiconductor device 100 is reduced.

Figure 7:
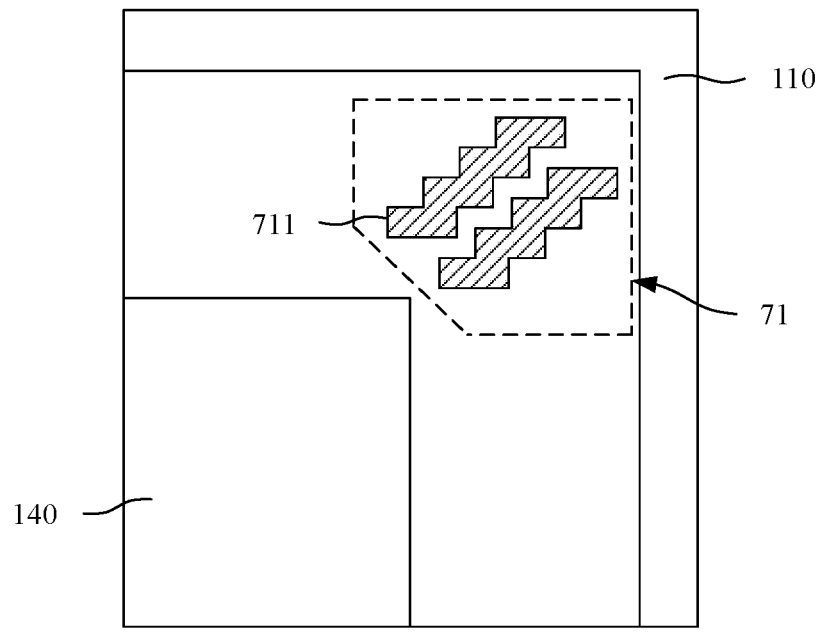
FIG. 7 is a schematic diagram of a partial planar structure of still another power semiconductor device according to an embodiment of this application.

In addition, in the foregoing embodiment, a step form of the metal block 711 may be raised from lower right to upper left as shown in FIG. 6, or may be raised from lower left to upper right as shown in FIG. 7. This is not limited in this application. Both of the two disposing manners can be used to improve the stress concentration degree, of the passivation layer 40, at the metal structure 71. Similarly, in each group of metal structures 71, the metal blocks 711 may be raised in a same manner. This helps reduce space occupied by the metal structure, and further reduce impact on an overall structure size of the power semiconductor device 100. It should be noted that orientation terms such as "up", "down", "left", and "right" used in embodiments of this application are mainly described based on presentation orientations in FIG. 6 and FIG. 7, and do not constitute a limitation on an orientation of the power semiconductor device 100 in an actual application scenario.

Figure 8:
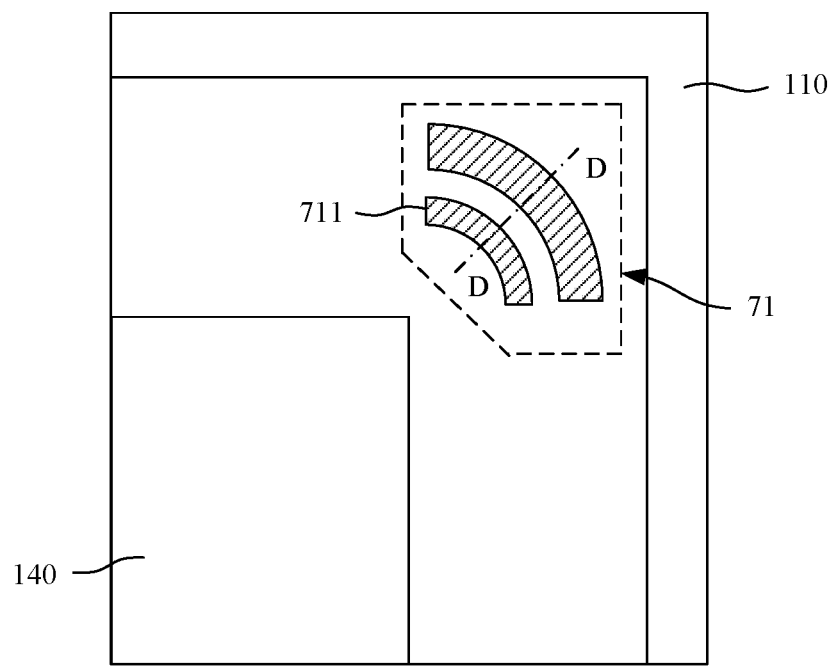
FIG. 8 is a schematic diagram of a partial planar structure of still another power semiconductor device according to an embodiment of this application.

FIG. 8 is a schematic diagram of a partial planar structure of still another power semiconductor device according to an embodiment of this application. Refer to FIG. 5 for a schematic diagram of a cross-sectional structure of the power semiconductor device shown in FIG. 8 at a D-D location. Refer to FIG. 5 and FIG. 8. In this embodiment, a section that is of the metal block 711 and that is perpendicular to a thickness direction of the power semiconductor device 100 may further be arc-shaped. In some embodiments, the metal block 711 may protrude toward the edge of the power semiconductor device 100, and a central angle of an arc may range from 0° to 90°. For example, when the central angle of the arc is 90°, tangent lines of endpoints on two sides of the arc may be respectively disposed along two adjacent edges of the first surface of the epitaxial layer 20. Similar to the foregoing embodiment, this disposing manner can also be used to improve the stress concentration degree, of the passivation layer 40, at the metal structure 71, so that impact on an electrical functional region of the power semiconductor device 100 is reduced.

The foregoing embodiments illustrate several metal blocks of different structure forms and their disposing manners. It should be understood that the metal blocks in embodiments of this application are not limited to the foregoing several structures, and a metal block that is in another form and has a similar structure feature may also be applied to embodiments of this application, provided that an effect of stress concentration can be achieved. This is not listed one by one herein.

Refer to FIG. 3 again. An embodiment of this application further provides a method for producing the power semiconductor device 100, including the following operations.

Operation 1: Form the epitaxial layer 20 on the semiconductor substrate 10. The semiconductor substrate 10 and the epitaxial layer 20 may be made of silicon carbide materials, and both of the semiconductor substrate 10 and the epitaxial layer 20 are doped with first-type impurities. Doping density of the first-type impurity at the epitaxial layer 20 may be different from doping density of the first-type impurity on the semiconductor substrate 10. For example, the doping density of the first-type impurity at the epitaxial layer 20 may be less than the doping density of the first-type impurity on the semiconductor substrate 10.

Operation 2: Form several first doped regions 21 on the first surface that is of the epitaxial layer 20 and that is away from the semiconductor substrate 10, where the first doped region 21 is doped with the second-type impurity. The first doped region 21 in the active region 130 may be of a block structure, and a plurality of first doped regions 21 in the active region 130 may be arranged in an array. The first doped region 21 in the terminal region 120 may be of a ring structure, and a plurality of first doped regions 21 in the terminal region 120 may be arranged in a radial manner.

Operation 3: Form the annular field oxidized layer 60 on the first surface of the epitaxial layer 20. An outer side of the field oxidized layer 60 and the scribing region 110 are disposed at a spacing, and an inner side of the field oxidized layer 60 is disposed close to an edge of the active region 130. The field oxidized layer 60 can protect a surface of the terminal region 120, and reduce impact of an external charge on the terminal region 120, so that working reliability of the power semiconductor device 100 can be improved.

Operation 4: Form the first metal layer 30 and the second metal layer 70 on one side that is of the epitaxial layer 20 and that is away from the semiconductor substrate 10. The first metal layer 30 is disposed on the first surface of the epitaxial layer 20, and the first metal layer 30 may cover an inner edge of the field oxidized layer 60. The second metal layer 70 is disposed on a surface that is of the field oxidized layer 60 and that is away from the epitaxial layer 20, and a projection of the second metal layer 70 on the first surface of the epitaxial layer 20 is located on an outer side of the first doped region 21 at the most edge of the terminal region 120, that is, the second metal layer 70 is located outside the electrical functional region of the power semiconductor device 100.

Operation 5: Form the annular passivation layer 40 on one side that is of the first metal layer 30 and the second metal layer 70 and that is away from the epitaxial layer 20. The passivation layer 40 may cover the second metal layer 70 and the edge of the first metal layer 30, and an outer side of the passivation layer 40 and the scribing region 110 are disposed at a spacing. The passivation layer 40 can protect against ingress of external impurities and moisture, so that stability and reliability of the power semiconductor device 100 can be improved. In addition, the passivation layer 40 may form the step structure 41 at the second metal layer 70. In the reliability test processes such as temperature cycling and temperature shock, the stress concentration point of the passivation layer 40 may be transferred to the step structure 41 close to the corner of the power semiconductor device 100. Because the second metal layer 70 is far away from the electrical functional region of the power semiconductor device 100, even if the passivation layer 40 cracks at the step structure 41 in the region, the electrical functional region of the power semiconductor device 100 is not affected, so that a risk of an electrical failure of the device can be reduced.

Operation 6: Form the annular protective layer 50 on one side that is of the passivation layer 40 and that is away from the semiconductor substrate 10. An inner side of the protective layer 50 may cover the passivation layer 40 and a part of the first metal layer 30, and an outer side of the protective layer 50 may extend to the scribing region 110. The protective layer 50 may be configured to mitigate extrusion of a plastic packaging material on a surface of the device in a subsequent packaging process, and can further prevent particles in the plastic packaging material from spreading to inside of the device, so that the stability and reliability of the power semiconductor device 100 can be improved.

It should be noted that, in this embodiment of this application, the second metal layer 70 and the first metal layer 30 may be manufactured by using a same process. In an embodiment, an entire metal layer may be formed on one side that is of the field oxidized layer 60 and that is away from the epitaxial layer 20, and then a redundant metal material is removed by using a process such as masking or etching, to form the first metal layer 30 and the second metal layer 70. Therefore, in this embodiment of this application, without increasing process steps and manufacturing costs, the stress concentration point is transferred to the corner of the power semiconductor device 100, to reduce the risk of the electrical failure of the device.

The foregoing embodiments are described by using an example in which the power semiconductor device is the Schottky diode. In some other embodiments of this application, the power semiconductor device may alternatively be a power MOSFET. The following uses an example in which the power semiconductor device is the power MOSFET for description.

Figure 9:
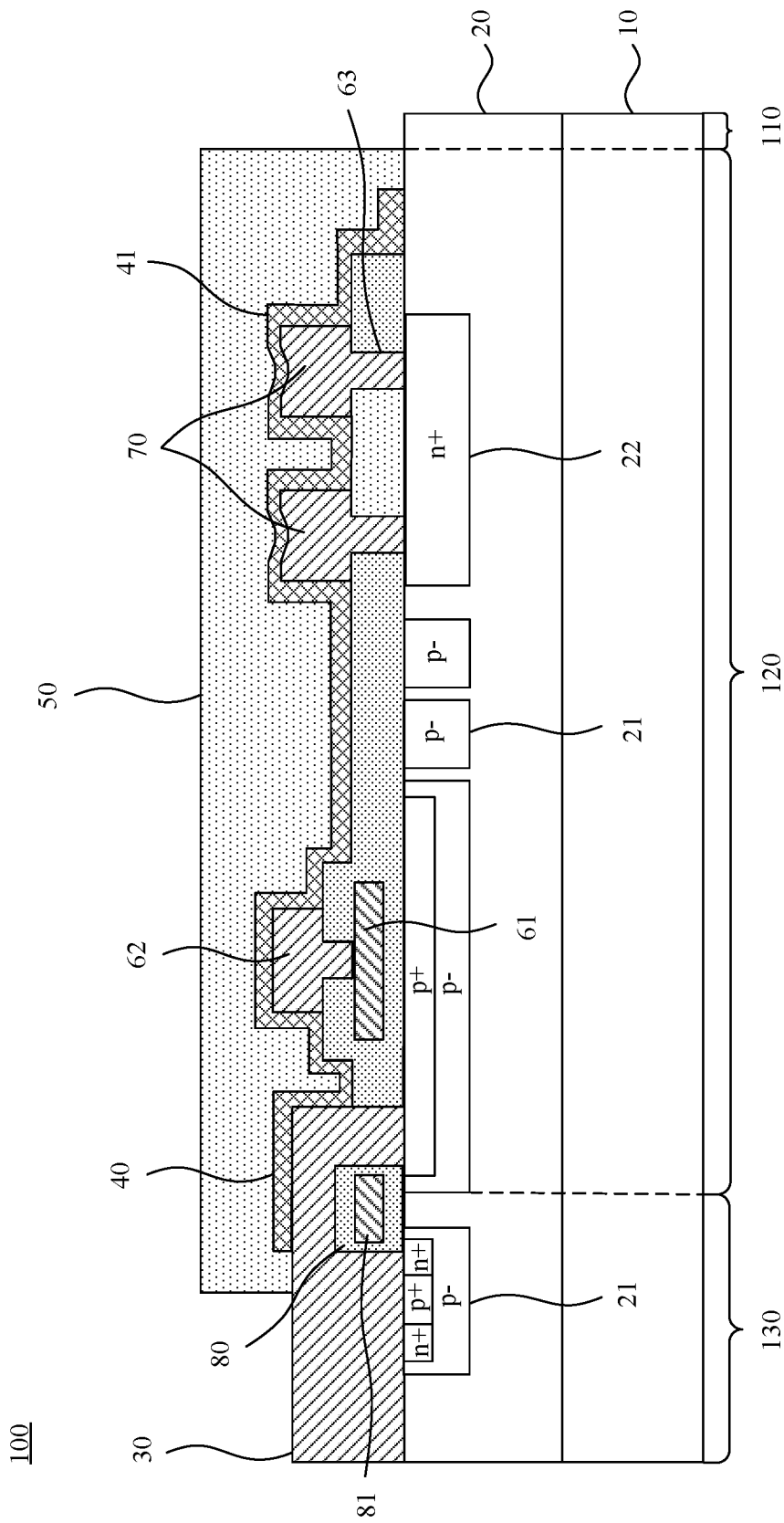
FIG. 9 is a schematic diagram of a partial cross-sectional structure of still another power semiconductor device according to an embodiment of this application.

FIG. 9 is a schematic diagram of a partial cross-sectional structure of still another power semiconductor device according to an embodiment of this application. Refer to FIG. 9. In this embodiment, the power semiconductor device 100 may also include the semiconductor substrate 10, the epitaxial layer 20, the field oxidized layer 60, the first metal layer 30, the second metal layer 70, the passivation layer 40, and the protective layer 50. For relative location relationships of the semiconductor substrate 10, the epitaxial layer 20, the field oxidized layer 60, the first metal layer 30, the second metal layer 70, the passivation layer 40, and the protective layer 50, refer to the disposing manner in the foregoing embodiment. Details are not described herein again.

In this embodiment of this application, an N-type doped region and a P-type doped region are further disposed in the first doped region 21 located in the active region 130. For example, the second-type impurity doped in the first doped region 21 is the P-type impurity. Three diffusion regions may be disposed in parallel in the first doped region 21: two N-type doped regions and a P-type doped region disposed between the two N-type doped regions. Doping density of the P-type impurity in the P-type doped region is greater than doping density of the P-type impurity in the first doped region 21.

An insulation layer 80 is further disposed on the first surface of the epitaxial layer 20, and the first metal layer 30 may pass through a through hole at the insulation layer 80 to be electrically connected to the N-type doped region and the P-type doped region in the first doped region 21. Materials of the insulation layer 80 and the field oxidized layer 60 are the same. For example, both of the insulation layer 80 and the field oxidized layer 60 may be made of a silicon dioxide material. A gate 81 is disposed at the insulation layer 80, and the gate 81 may be made of a polycrystalline silicon material.

In this embodiment, the first metal layer 30 is a source of the power semiconductor device 100. It should be noted that, in the following embodiments, a mark of the source is the same as a mark of the first metal layer 30. A drain metal (not shown in the figure) is further disposed on a surface that is of the semiconductor substrate 10 and that is away from the epitaxial layer 20, and the gate 81 may be configured to receive a control signal that drives the source 30 and the drain to conduct. Specifically, when a positive voltage is applied between the source 30 and the drain, a voltage between the gate 81 and the source 30 is zero, a PN junction formed between the first doped region 21 and the epitaxial layer 20 is anti-biased, no current flows between the source 30 and the drain, and the power semiconductor device 100 is in a cut-off state. When a positive voltage is applied between the gate 81 and the source 30, the positive voltage of the gate 81 pushes away an electron hole in the first doped region 21 under the gate 81, to attract an electron in the first doped region 21 to a surface of the first doped region 21 under the gate 81. When the applied positive voltage is greater than a turn-on voltage, electron number density of the surface of the first doped region 21 under the gate 81 exceeds electron hole density, so that the P-type semiconductor is inverted into an N-type semiconductor and becomes an inverted layer. The inverted layer forms an N-channel and the PN junction disappears, and the source 30 and the drain conduct.

In addition, on one side that is of the field oxidized layer 60 and that is close to the first metal layer 30, a polycrystalline silicon material 61 connected to the gate 81 is further disposed at the insulation layer 80. A gate signal cable 62 is further disposed on one side that is of the field oxidized layer 60 and that is away from the epitaxial layer 20. The gate signal cable 62 is connected to the polycrystalline silicon material 61 at the insulation layer 80 by using the through hole disposed at the insulation layer 80, to be connected to the gate 81 in the active region 130. In this way, the control signal is sent to the gate 81.

Similar to the foregoing embodiment, in this embodiment, the second metal layer 70 is disposed between the field oxidized layer 60 and the passivation layer 40, and the projection of the second metal layer 70 on the first surface of the epitaxial layer 20 is located on an outer side of the first doped region 21 at the most edge of the terminal region 120, that is, the second metal layer 70 is located outside an electrical functional region of the power semiconductor device 100, so that the passivation layer 40 forms the step structure 41 at the second metal layer 70 at the edge of the power semiconductor device 100. In reliability tests such as temperature cycling and temperature shock, the stress concentration point of the passivation layer 40 may be transferred to the step structure 41 formed by the passivation layer 40 at the second metal layer 70. Even if the passivation layer 40 cracks at the step structure 41, the electrical functional region of the power semiconductor device 100 is not affected, so that a risk of an electrical failure of the power semiconductor device 100 can be reduced.

For a shape of a metal block at the second metal layer 70, refer to the disposing manner in the foregoing embodiment. For example, a cross section shape of the metal block may be L-shaped, step-shaped, arc-shaped, or the like. Details are not described herein again.

Still refer to FIG. 9, in this embodiment of this application, a location that is of the field oxidized layer 60 and that is corresponding to second metal layer 70 may be further provided with a through hole 63, and the second metal layer 70 may be electrically connected to the epitaxial layer 20 by using the through hole 63, so that the second metal layer 70 and the epitaxial layer 20 can maintain equipotential, to further improve performance reliability of the power semiconductor device 100. A second doped region 22 doped with the first-type impurity may be further disposed at a location that is on the first surface of the epitaxial layer 20 and that is corresponding to the through hole 63, and the second metal layer 70 may be electrically connected to the second doped region 22 by using the through hole 63. Doping density of the first-type impurity in the second doped region 22 may be greater than the doping density of the first-type impurity at the epitaxial layer 20, so that this can more effectively ensure the second metal layer 70 and the epitaxial layer 20 maintain equipotential.

Figure 10:
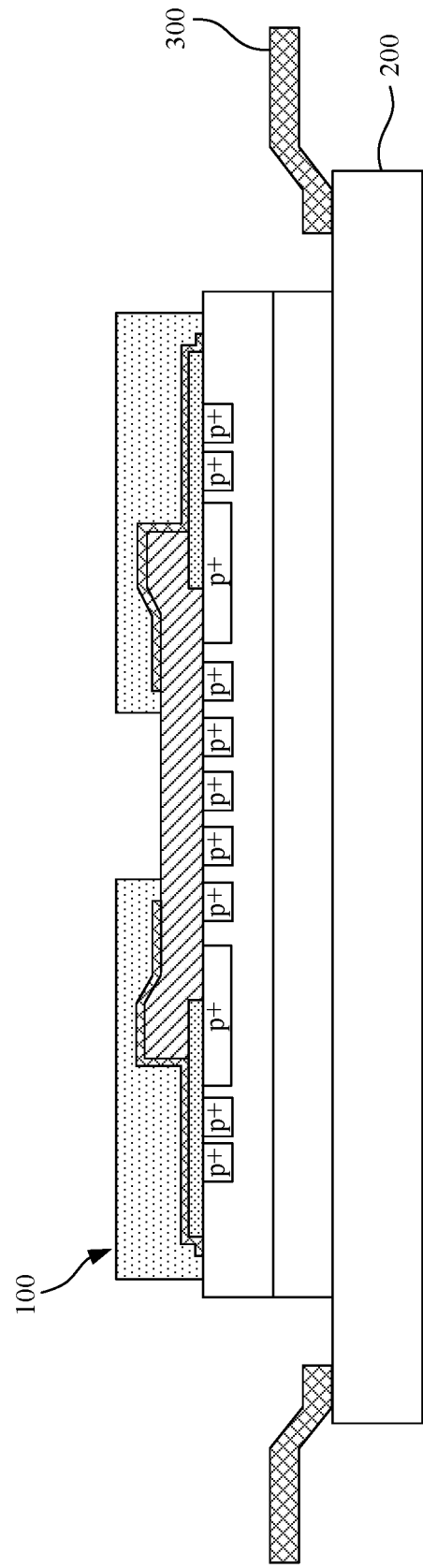
FIG. 10 is a schematic diagram of a structure of a packaging structure according to an embodiment of this application.

Refer to FIG. 10. An embodiment of this application further provides a packaging structure. The packaging structure may include the substrate 200, the lead 300, and the power semiconductor device 100 in any one of the foregoing possible embodiments. The power semiconductor device 100 may be disposed on a surface of the substrate 200. The lead 300 is disposed on a surface that is of the substrate 200 and that is on a same side as the power semiconductor device 100, the lead 300 is disposed around the power semiconductor device 100, and a first end of the lead 300 is electrically connected to the power semiconductor device 100. In some embodiments, the power semiconductor device 100 may be a Schottky diode or a power MOSFET. In reliability tests such as temperature cycling and temperature shock, a stress concentration point of the power semiconductor device 100 may be transferred to a corner region. Even if there is a crack, an electrical functional region of the power semiconductor device 100 is not affected, so that a risk of an electrical failure of the power semiconductor device 100 can be reduced, and reliability of a packaging structure can be further improved.

An embodiment of this application further provides an electronic device. The electronic device may be a device, for example, a communications device, a server, a supercomputer, a router, or a switch in the conventional technology. The electronic device may include a circuit board and the packaging structure in the foregoing embodiment. The packaging structure may be fastened on the circuit board by means of soldering or the like. A signal pin may be disposed in a region that is on the circuit board and that is away from a semiconductor device, and the signal pin may be electrically connected to a second end of a lead, so that the packaging structure can be connected to another device by using a cable on the circuit board, and a connection between the power semiconductor device and an external circuit is further implemented. Because a risk of an electrical failure of the power semiconductor device is low, stability of the electronic device can be improved.

The foregoing description is merely a specific implementation of this application, but is not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A power semiconductor device, comprising:
   a semiconductor substrate, wherein the semiconductor substrate is doped with a first-type impurity;
   an epitaxial layer, wherein the epitaxial layer is doped with the first-type impurity and the epitaxial layer is disposed on a surface of the semiconductor substrate;
   a first doped region doped with a second-type impurity that is disposed on a first surface of the epitaxial layer and that is on a side of the epitaxial layer that is opposite the semiconductor substrate, wherein a circumferential edge of the first surface of the epitaxial layer comprises a scribing region;
   a first metal layer disposed on the side of the epitaxial layer that is opposite the semiconductor substrate, wherein the first metal layer is electrically connected to the epitaxial layer;
   a second metal layer disposed on the side of the epitaxial layer that is opposite the semiconductor substrate, wherein the second metal layer is located in an annular region between an edge of the first metal layer and the scribing region, wherein the annular region is a rectangular ring, and wherein four corner parts of the annular region are respectively disposed opposite to four corner parts of the epitaxial layer; and
   a passivation layer, wherein the passivation layer is of an annular structure and is on the second metal layer and on a part of the first metal layer.

2. The power semiconductor device according to claim 1, wherein the second metal layer comprises a plurality of groups of metal structures, the plurality of groups of metal structures are distributed in the annular region, and the plurality of groups of metal structures are disposed in pairs.

3. The power semiconductor device according to claim 2, wherein a cross section of the epitaxial layer that is perpendicular to a thickness direction of the power semiconductor device is rectangular, and
   wherein there are four groups of the metal structures, and the four groups of the metal structures are respectively located in the four corner parts of the annular region.

4. The power semiconductor device according to claim 2, wherein each of the plurality of groups of metal structures comprises a metal block.

5. The power semiconductor device according to claim 4, wherein the metal block comprises a first part and a second part that are separated by an included angle.

6. The power semiconductor device according to claim 5, wherein the first part and the second part are respectively disposed along two adjacent sides of the first surface of the epitaxial layer.

7. The power semiconductor device according to claim 4, wherein a cross section of the metal block that is perpendicular to a thickness direction of the power semiconductor device is step-shaped.

8. The power semiconductor device according to claim 7, wherein the metal block comprises a step plane and a connection surface connected between two adjacent step planes, and
   wherein the step plane and the connection surface are respectively disposed along two adjacent sides of the first surface of the epitaxial layer.

9. The power semiconductor device according to claim 4, wherein a cross section of the metal block that is perpendicular to a thickness direction of the power semiconductor device is arc-shaped.

10. The power semiconductor device according to claim 1, wherein the power semiconductor device further comprises a field oxidized layer, the field oxidized layer is of an annular structure, an outer side of the field oxidized layer and the scribing region are spaced apart, and an inner side of the field oxidized layer is located between the edge of the first metal layer and the epitaxial layer, and
   wherein the second metal layer is disposed on a surface of the field oxidized layer that is opposite the epitaxial layer.

11. The power semiconductor device according to claim 10, wherein the field oxidized layer comprises a through hole, and the second metal layer is electrically connected to the epitaxial layer by using the through hole.

12. The power semiconductor device according to claim 11, wherein a second doped region is further disposed at a location on the first surface of the epitaxial layer that corresponds to the through hole, and the second doped region is doped with the first-type impurity, and
wherein the second metal layer is electrically connected to the second doped region by using the through hole.

13. The power semiconductor device according to claim 1, wherein the passivation layer comprises at least one layer structure made of a dielectric material.

14. The power semiconductor device according to claim 1, wherein the power semiconductor device further comprises a protective layer, the protective layer is of an annular structure, and the protective layer is on the passivation layer and on a part of the first metal layer.

15. A packaging structure, comprising a substrate, a lead, and a power semiconductor device, wherein the power semiconductor device comprises:
a semiconductor substrate, wherein the semiconductor substrate is doped with a first-type impurity;
an epitaxial layer, wherein the epitaxial layer is doped with the first-type impurity and the epitaxial layer is disposed on a surface of the semiconductor substrate;
a first doped region doped with a second-type impurity that is disposed on a first surface of the epitaxial layer and that is on a side of the epitaxial layer that is opposite the semiconductor substrate, and wherein a circumferential edge of the first surface of the epitaxial layer comprises a scribing region;
a first metal layer disposed on the side of the epitaxial layer that is opposite the semiconductor substrate, wherein the first metal layer is electrically connected to the epitaxial layer;
a second metal layer, disposed on the side of the epitaxial layer that is opposite the semiconductor substrate, wherein the second metal layer is located in an annular region between an edge of the first metal layer and the scribing region, wherein the annular region is a rectangular ring, and wherein four corner parts of the annular region are respectively disposed opposite to four corner parts of the epitaxial layer; and
a passivation layer, wherein the passivation layer is of an annular structure and is on the second metal layer and on a part of the first metal layer,
wherein the power semiconductor device is disposed on a surface of the substrate, and
wherein the lead is disposed on the surface of the substrate that is on a same side as the power semiconductor device, the lead is disposed around the power semiconductor device, and a first end of the lead is electrically connected to the power semiconductor device.

16. An electronic device, comprising a circuit board and a packaging structure,
wherein the packaging structure comprises a substrate, a lead, and a power semiconductor device,
wherein the power semiconductor device comprises:
a semiconductor substrate, wherein the semiconductor substrate is doped with a first-type impurity;
an epitaxial layer, wherein the epitaxial layer is doped with the first-type impurity and the epitaxial layer is disposed on a surface of the semiconductor substrate;
a first doped region doped with a second-type impurity that is disposed on a first surface of the epitaxial layer and that is on a side of the epitaxial layer that is opposite the semiconductor substrate, and wherein a circumferential edge of the first surface of the epitaxial layer comprises a scribing region;
a first metal layer disposed on the side of the epitaxial layer that is opposite the semiconductor substrate, wherein the first metal layer is electrically connected to the epitaxial layer;
a second metal layer disposed on the side of the epitaxial layer that is opposite the semiconductor substrate, wherein the second metal layer is located in an annular region between an edge of the first metal layer and the scribing region, wherein the annular region is a rectangular ring, and wherein four corner parts of the annular region are respectively disposed opposite to four corner parts of the epitaxial layer; and
a passivation layer, wherein the passivation layer is of an annular structure and is on the second metal layer and on a part of the first metal layer,
wherein the power semiconductor device is disposed on a surface of the substrate, and
wherein the lead is disposed on the surface of the substrate that is on a same side as the power semiconductor device, the lead is disposed around the power semiconductor device, and a first end of the lead is electrically connected to the power semiconductor device, and
wherein the packaging structure is disposed on the circuit board, a signal pin is disposed in a region that is on the circuit board, and the signal pin is electrically connected to a second end of the lead.

17. The electronic device according to claim 16, wherein the second metal layer comprises a plurality of groups of metal structures, the plurality of groups of metal structures are distributed in the annular region, and the plurality of groups of metal structures are disposed in pairs.

18. The electronic device according to claim 17, wherein each of the plurality of groups of metal structures comprises a metal block.

19. The electronic device according to claim 18, wherein the metal block comprises a first part and a second part that are separated by an included angle.

20. The electronic device according to claim 16, wherein the power semiconductor device further comprises a field oxidized layer, the field oxidized layer is of an annular structure, an outer side of the field oxidized layer and the scribing region are spaced apart, and an inner side of the field oxidized layer is located between the edge of the first metal layer and the epitaxial layer, and
wherein the second metal layer is disposed on a surface of the field oxidized layer that is opposite the epitaxial layer.

* * * * *